US009859519B2

(12) United States Patent
Kim et al.

(10) Patent No.: US 9,859,519 B2
(45) Date of Patent: *Jan. 2, 2018

(54) ORGANIC LIGHT EMITTING DISPLAY DEVICE

(71) Applicant: LG Display Co., Ltd., Seoul (KR)

(72) Inventors: Seunghyun Kim, Gwangju (KR); Hongseok Choi, Seoul (KR); Sung Hoon Pieh, Seoul (KR); Tae Seok Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/582,382

(22) Filed: Apr. 28, 2017

(65) Prior Publication Data

US 2017/0237031 A1    Aug. 17, 2017

Related U.S. Application Data

(63) Continuation of application No. 14/842,721, filed on Sep. 1, 2015, now Pat. No. 9,666,824.

(30) Foreign Application Priority Data

Nov. 28, 2014  (KR) .................. 10-2014-0168260

(51) Int. Cl.
*H01L 51/50*  (2006.01)
*H01L 51/52*  (2006.01)

(52) U.S. Cl.
CPC ...... *H01L 51/5044* (2013.01); *H01L 51/5004* (2013.01); *H01L 51/5056* (2013.01); *H01L 51/5265* (2013.01); *H01L 2251/558* (2013.01)

(58) Field of Classification Search
None
See application file for complete search history.

(56) References Cited

U.S. PATENT DOCUMENTS

2003/0170491 A1*  9/2003  Liao .................. H01L 51/5036
428/690
2003/0189401 A1  10/2003  Kido et al.
(Continued)

FOREIGN PATENT DOCUMENTS

WO    WO 2012-141107 A1    10/2012

*Primary Examiner* — Lex Malsawma
(74) *Attorney, Agent, or Firm* — Fenwick & West LLP

(57) ABSTRACT

An organic light emitting display device comprises first and second electrodes facing each other on a substrate; and three emission portions arranged between the first electrode and the second electrode, wherein at least one among the three emission portions includes two emitting layers, and the first, second and third emission portions being collectively configured as a TOL-FESE (Thickness of Organic Layers between the First Electrode and the Second Electrode) structure in which thicknesses of organic layers between the first electrode and the second electrode are different from one another, each organic layer having a specified thickness that provides the organic light emitting display device having the TOL-FESE structure with improved red efficiency or blue efficiency and minimized color shift rate with respect to a viewing angle, when compared to an organic light emitting display device that lacks the TOL-FESE structure.

18 Claims, 8 Drawing Sheets

(56) References Cited

U.S. PATENT DOCUMENTS

| | | |
|---|---|---|
| 2006/0244370 A1* | 11/2006 | Tyan .................. H01L 51/5278 |
| | | 313/506 |
| 2007/0001587 A1 | 1/2007 | Hatwar et al. |
| 2007/0231596 A1* | 10/2007 | Spindler ............ H01L 51/5052 |
| | | 428/690 |
| 2008/0224602 A1* | 9/2008 | Choi ................... H01L 51/5278 |
| | | 313/504 |
| 2010/0253209 A1 | 10/2010 | Spindler et al. |
| 2012/0241794 A1 | 9/2012 | Seo et al. |
| 2012/0248971 A1 | 10/2012 | Okuyama |
| 2014/0167016 A1 | 6/2014 | Yoo et al. |
| 2014/0183496 A1 | 7/2014 | Heo et al. |
| 2014/0339509 A1 | 11/2014 | Choi et al. |
| 2015/0014674 A1 | 1/2015 | Wehlus et al. |
| 2016/0035994 A1 | 2/2016 | Sung et al. |

* cited by examiner

ORGANIC LIGHT EMITTING DISPLAY DEVICE

CROSS REFERENCE TO RELATED APPLICATIONS

This application is a continuation of U.S. patent application Ser. No. 14/842,721 filed on Sep. 1, 2015, which claims the benefit of Korean Patent Application No. 10-2014-0168260 filed on Nov. 28, 2014, which is hereby incorporated by reference for all purposes as if fully set forth herein.

BACKGROUND OF THE INVENTION

Field of the Invention

The present invention relates to an organic light emitting display device, and more particularly, to an organic light emitting display device that may improve efficiency and a color shift rate.

Discussion of the Related Art

Recently, with the advancement of the information age, a display field for visually displaying an electric information signal has been rapidly developed. In response to this trend, various flat panel display devices having excellent properties of a thin profile, a light weight, and low power consumption have been developed.

Detailed examples of the flat panel display devices include liquid crystal display (LCD) devices, plasma display panel (PDP) devices, field emission display (FED) devices, and organic light emitting display (OLED) devices.

Particularly, the organic light emitting display device is a self-light emitting diode, and is more advantageous than the other flat panel display devices in view of fast response speed, high light emission efficiency, high luminance and a broad viewing angle.

In the organic light emitting display diode, an organic emitting layer is formed between two electrodes, electrons and holes from the two electrodes are injected into the organic emitting layer to generate an exciton through recombination of the electrons and the holes, and light is generated when the exciton is transited from the excited state to a ground state.

PRIOR ART REFERENCE

Patent Reference (Patent reference 1) 1. White organic light emitting diode (Korean Patent Application No. 10-2009-0092596)

The organic light emitting diode provides a full color in sub pixels emitting light of red (R), green (G) and blue (B). The sub pixels emitting light of red (R), green (G) and blue (B) may represent a color reproduction ratio through a color coordinate of each of red (R), green (G) and blue (B). The color coordinate has high dependency on a material of an emitting layer, and a triplet exciton contributes to light emission in case of a phosphorescent material of the emitting layer, whereby an organic light emitting diode of high efficiency may be obtained compared to a florescent material.

However, efforts to improve color coordinate properties and a color reproduction ratio of an organic light emitting diode have been made continuously in accordance with a demand of consumers who desire excellent picture quality.

As one solution, there is a method for using an emitting layer as a single layer. This method may fabricate a white organic light emitting diode in such a manner that a single material is used or two kinds of materials are doped. For example, red and green dopants may be used for a blue host, or red, green and blue dopants may additionally be used for a host material having high band gap energy. However, this method has problems in that energy transferred to the dopants is incomplete and it is difficult to control a white balance.

Also, there is limitation in components of dopants in the corresponding emitting layer due to properties of the dopants. When the respective emitting layers are mixed with one another, it is focused on generating white light, whereby wavelength property is generated in another wavelength and not in the wavelength of red, green and blue. Therefore, a problem occurs in that efficiency of red, green and blue is deteriorated due to an unwanted wavelength value.

As another solution, a structure may be provided in which two emitting layers of which colors are complementary to each other are deposited to emit white light. However, this structure generates a difference between a wavelength area corresponding to a wavelength of each emitting layer and a transmissive area of a color filter when white light passes through the color filter. Therefore, a problem occurs in that it is difficult to obtain a desired color reproduction ratio as a color range, which may be displayed, becomes narrow.

In this way, a problem occurs in that a color reproduction ratio is deteriorated if efficiency of red, green and blue is improved, whereas efficiency of red, green and blue is deteriorated if the color reproduction ratio is improved.

In this respect, the inventors of the present invention have recognized the aforementioned problems and invented an organic light emitting display device of a new structure, which may improve both efficiency and a color reproduction ratio.

SUMMARY OF THE INVENTION

Accordingly, the present invention is directed to an organic light emitting display device that substantially obviates one or more problems due to limitations and disadvantages of the related art.

An object of the present invention is to provide an organic light emitting display device that may improve red efficiency as one emission portion includes two emitting layers including a red emitting layer.

Another object of the present invention is to provide an organic light emitting display device that may improve efficiency and a color shift rate by optimizing thicknesses of organic layers constituting emission portions.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device comprises first and second electrodes facing each other on a substrate; a first emission portion on the first electrode, the first emission portion including a first emitting layer; a second emission portion on the first emission portion, the second emission portion including a second emitting layer; and a third emission portion on the second emission portion, the third emission portion including a third emitting layer and a fourth emitting layer, wherein a thickness of all organic layers between the first electrode and the second electrode is within a range of 370 nm to 445 nm to improve blue efficiency or red efficiency and color shift rate.

A thickness of a first organic layer between the first electrode and the first emitting layer is within a range of 90 nm to 110 nm.

A thickness of a second organic layer between the first organic layer and the second emitting layer is within a range of 60 nm to 75 nm.

A thickness of a third organic layer between the second organic layer and the third emitting layer is within a range of 155 nm to 175 nm.

A thickness of a fourth organic layer between the third organic layer and the second electrode is within a range of 65 nm to 85 nm.

If the first hole transporting layer includes two layers, the thickness of the first hole transporting layer close to the first electrode may be thinner than the thickness of the first hole transporting layer close to the first emitting layer.

The first emitting layer includes one among a blue emitting layer, a deep blue emitting layer, and a sky blue emitting layer.

The second emitting layer includes one among a yellow-green emitting layer and a green emitting layer.

The third emitting layer includes a red emitting layer, and the fourth emitting layer includes one among a blue emitting layer, a deep blue emitting layer, and a sky blue emitting layer.

The first emission portion has an electroluminescence (EL) peak in the range of 440 nm to 480 nm, the second emission portion has an EL peak in the range of 540 nm to 580 nm, and the third emission portion has an EL peak in the range of 600 nm to 640 nm and 440 nm to 480 nm.

The color shift rate $\Delta u'v'$ is 0.020 or less in viewing angles 0° to 60° of the organic light emitting display device. The color shift rate $\Delta u'v'$ in a specific viewing angle denotes a difference between the color shift rate in the viewing angle 0° and the color shift rate in the specific viewing angle. For example, the color shift rate $\Delta u'v'$ in the viewing angle 60° denotes a difference between the color shift rate in the viewing angle 0° and the color shift rate of the viewing angle 60°. The viewing angle 60° may be an angle in a side direction of the organic light emitting display device. And the color shift rate $\Delta u'v'$ is measured by CIE 1976 UCS diagram (u'v' coordinate system).

In another aspect of the present invention, an organic light emitting display device comprises first and second electrodes facing each other on a substrate; a first emission portion on the first electrode; a second emission portion on the first emission portion; and a third emission portion on the second emission portion, wherein at least one among the first emission portion, the second emission portion and the third emission portion includes two emitting layers, and the first, second and third emission portions being collectively configured as a TOL-FESE (Thickness of Organic Layers between the First Electrode and the Second Electrode) structure in which thicknesses of organic layers between the first electrode and the second electrode are different from one another, each organic layer having a specified thickness that provides the organic light emitting display device having the TOL-FESE structure with improved red efficiency or blue efficiency and minimized color shift rate with respect to a viewing angle, when compared to an organic light emitting display device that lacks the TOL-FESE structure.

The two emitting layers are included in the third emission portion.

The two emitting layers includes a red emitting layer and one among a blue emitting layer, a deep blue emitting layer, and a sky blue emitting layer.

An emission controlling layer further included between the red emitting layer and one among the blue emitting layer, the deep blue emitting layer and the sky blue emitting layer.

A total thickness of all organic layers between the first electrode and the second electrode have a thickness within the range of 370 nm to 445 nm.

A first organic layer between the first electrode and a first emitting layer in the first emission portion has a thickness in the range of 90 nm to 110 nm.

A second organic layer between the first organic layer and a second emitting layer in the second emission portion has a thickness in the range of 60 nm to 75 nm.

A third organic layer between the second organic layer and a third emitting layer in the third emission portion has a thickness in the range of 155 nm to 175 nm.

A fourth organic layer between the third organic layer and the second electrode has a thickness in the range of 65 nm to 85 nm.

The first emitting layer of the first emission portion includes one among a blue emitting layer, a deep blue emitting layer, and a sky blue emitting layer.

The second emitting layer of the second emission portion includes one among a yellow-green emitting layer and a green emitting layer.

The first emission portion has an electroluminescence (EL) peak in the range of 440 nm to 480 nm, the second emission portion has an EL peak in the range of 540 nm to 580 nm, and the third emission portion has an EL peak in the range of 600 nm to 640 nm and 440 nm to 480 nm.

The color shift rate $\Delta u'v'$ is 0.020 or less in viewing angles 0° to 60° of the organic light emitting display device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
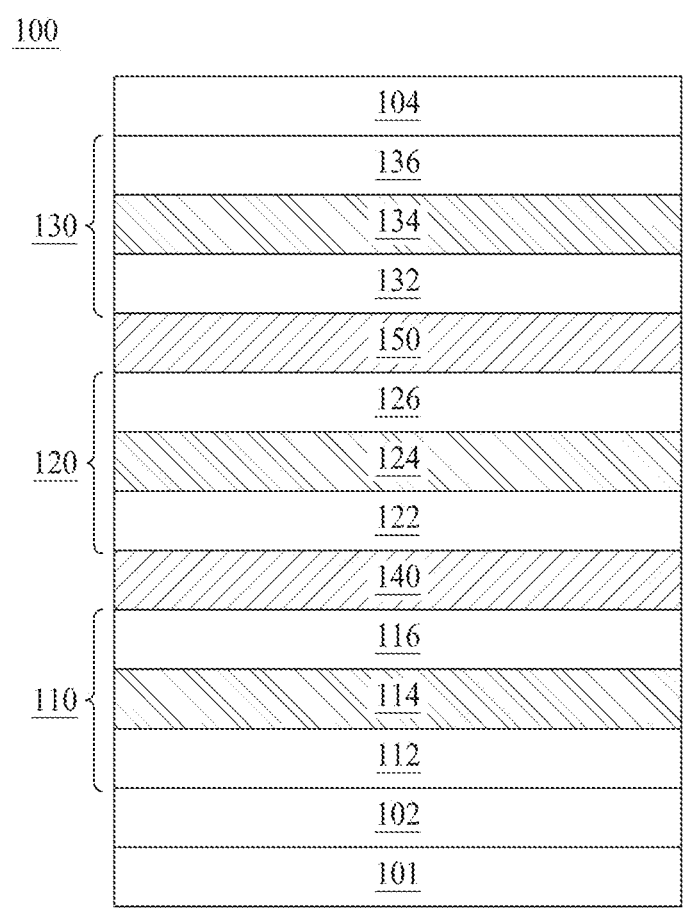
FIG. 1 is a brief cross-sectional diagram illustrating a white organic light emitting diode according to one embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the embodiments of the present invention will be described in detail with reference to the accompanying drawings.

FIG. 1 is a brief cross-sectional diagram illustrating a white organic light emitting diode according to one embodiment of the present invention.

The white organic light emitting diode 100 shown in FIG. 1 includes first and second electrodes 102 and 104 on a substrate 101, and first, second and third emission portions 110, 120 and 130 between the first and second electrodes 102 and 104.

The first electrode 102 is a positive electrode for supplying holes, and may be formed of, but are not limited to, ITO (indium tin oxide), IZO (indium zinc oxide), or the like, which is a transparent conductive material such as TCO (transparent conductive oxide).

The second electrode 104 is a negative electrode for supplying electrons, and may be formed of, but is not limited to, a metal material, such as Au, Ag, Al, Mo, Mg, or their alloys.

The first electrode 102 may be referred to as anode and the second electrode 104 may be referred to as cathode. Also, the first electrode 102 may be referred to as a transflective electrode, and the second electrode 104 may be referred to as a reflective electrode.

Hereinafter, a bottom emission type, in which the first electrode 102 is a transflective electrode and the second electrode 104 is a reflective electrode, will be described.

The first emission portion 110 may include a first hole transporting layer (HTL) 112, a first emitting layer (EML) 114, and a first electron transporting layer (ETL) 116, above the first electrode 102.

The first emitting layer (EML) 114 includes a blue emitting layer.

A first charge generating layer (CGL) 140 may further be provided between the first emission portion 110 and the second emission portion 120. The first charge generating layer (CGL) 140 controls charge balance between the first emission portion 110 and the second emission portion 120. The first charge generating layer 140 may include an N type charge generating layer (N-CGL) and a P type charge generating layer (P-CGL).

The second emission portion 120 may include a second hole transporting layer (HTL) 122, a second emitting layer (EML) 124, and a second electron transporting layer (ETL) 126.

The second emitting layer (EML) 124 of the second emission portion 120 includes a yellow-green emitting layer.

The third emission portion 130 may include a third electron transporting layer (ETL) 136, a third emitting layer (EML) 134, and a third hole transporting layer (HTL) 132, below the second electrode 104.

The third emitting layer (EML) 134 of the third emission portion 130 includes a blue emitting layer.

A second charge generating layer (CGL) 150 may further be provided between the second emission portion 120 and the third emission portion 130. The second charge generating layer (CGL) 150 controls charge balance between the second emission portion 120 and the third emission portion 130. The second charge generating layer (CGL) 150 may include an N type charge generating layer (N-CGL) and a P type charge generating layer (P-CGL).

In the organic light emitting display device that includes the organic light emitting diode according to one embodiment of the present invention, at least one among gate lines and data lines which define each pixel area, and a power line in parallel extended from any one among the gate lines and the data lines are arranged on a substrate, and a switching thin film transistor connected to the gate and data lines and a driving thin film transistor connected to the switching thin film transistor are arranged in each pixel area. The driving thin film transistor is connected to the first electrode 102.

An ElectroLuminescence (EL) peak of the organic light emitting display device that includes first, second and third emission portions is determined by the product of a PhotoLumincescence (PL) peak displaying a unique color of an emitting layer and an Emittance (EM) peak of organic layers constituting the organic light emitting diode. The emittance (EM) peak of the organic layers is affected by thicknesses and optical properties of the organic layers.

Viewing angle properties are varied depending on an overlap area of the PL peak and the EM peak of the organic layers. That is, electroluminescence properties are not varied depending on a viewing angle if the overlap area between the PL peak and the EM peak of the organic layers becomes greater, whereas electroluminescence properties are reduced depending on a viewing angle if the overlap area between the PL peak and the EM peak of the organic layers becomes smaller.

An overlap area of a PL peak of the blue emitting layer and the EM peak of the organic layers is different from an overlap area of a PL peak of the yellow-green emitting layer and the EM peak of the organic layers. In other words, the overlap area of the PL peak of the blue emitting layer and the EM peak of the organic layers is small, whereby color change with respect to the viewing angle occurs seriously. The overlap area of the PL peak of the yellow-green emitting layer and the EM peak of the organic layers is wide, whereby color change with respect to the viewing angle does not occur. Therefore, light emitted from the blue emitting layer has a viewing angle different from a viewing angle of light emitted from the yellow-green emitting layer, whereby a color coordinate of a white is moved. For this reason, a problem occurs in that it is difficult to obtain a desired color coordinate.

In the structure shown in FIG. 1, the thicknesses of the organic layers constituting the first, second and third emission portions are adjusted to correspond to efficiency of the organic light emitting diode. However, a problem occurs in that it is difficult to obtain a color shift rate per wavelength of the emission portions within the adjusted thicknesses. Although the thicknesses of the organic layers may be increased to obtain a desired color shift rate, a cavity is moved to a long wavelength area, whereby a problem occurs in that color purity is deteriorated. If viewing angle property is based on the cavity of the blue emitting layer, which is less efficient than the yellow-green emitting layer, blue efficiency is reduced, whereby a problem occurs in that efficiency of the organic light emitting diode is deteriorated.

This will be described with reference to FIGS. 2 and 3.

Figure 2:
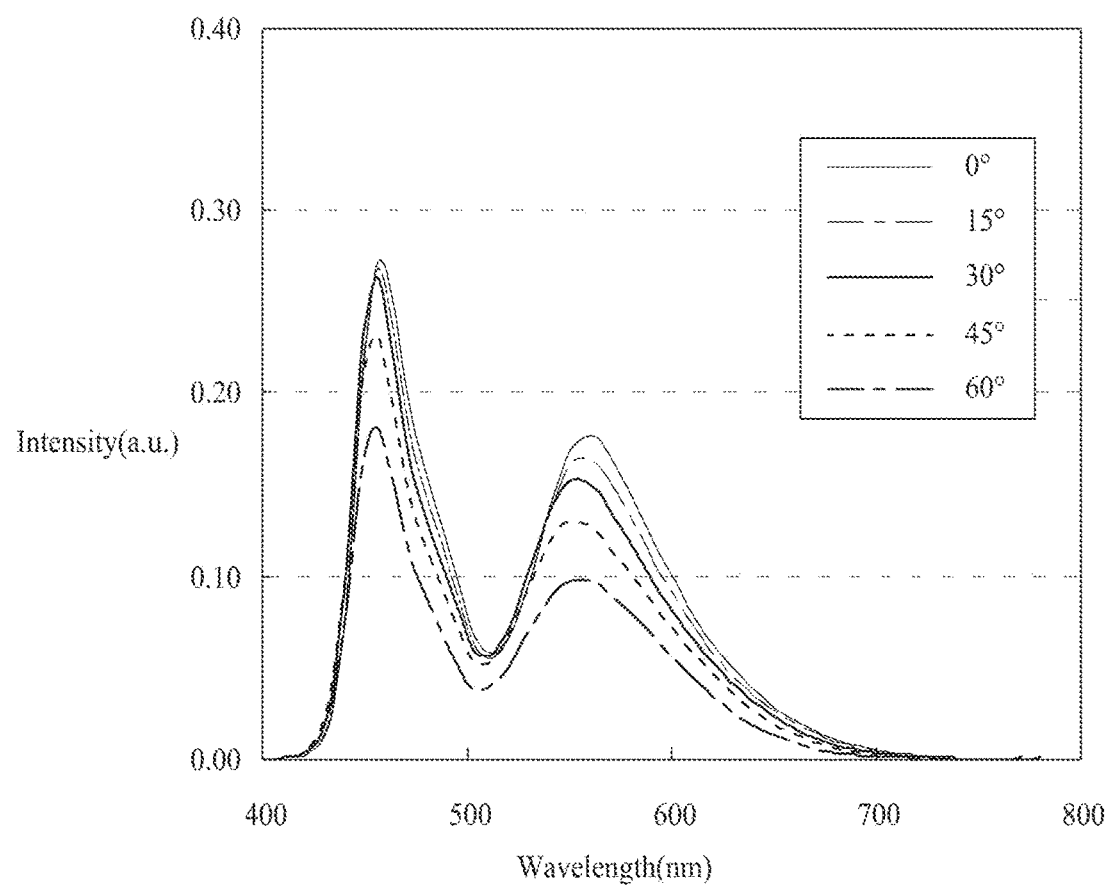
FIG. 2 is a diagram illustrating EL spectrum based on a viewing angle of an organic light emitting display device according to one embodiment of the present invention.

FIG. 2 is a diagram illustrating EL spectrum based on a viewing angle of an organic light emitting display device according to one embodiment of the present invention. In FIG. 2, a horizontal axis represents a wavelength area of light, and a vertical axis represents electroluminescence intensity. Electroluminescence intensity is a numeric value expressed as a relative value based on a maximum value of EL spectrum.

Also, in FIG. 2, a front side of the organic light emitting display device is set to 0° and an angle is varied from the front side, whereby the result of measurement at angles of 0°, 15°, 30°, 45° and 60° is shown.

In more detail, FIG. 2 illustrates the EL peak of the blue emitting layer emitted from the first and third emission portions of the organic light emitting display device and the EL peak of the yellow-green emitting layer emitted from the second emission portion.

As shown in FIG. 2, the EL peak corresponding to a blue area is within a range of 440 nm to 480 nm. In this wavelength area, it is noted that the EL peak is reduced depending on the viewing angle. And, the EL peak corresponding to a yellow-green area is within a range of 540 nm to 580 nm. In this wavelength area, it is noted that the EL peak is rapidly reduced depending on the viewing angle. Therefore, the EL peak corresponding to the yellow-green area occurs more strongly depending on the viewing angle than the EL peak corresponding to the blue area, whereby a white color coordinate is varied. For this reason, the color shift rate property is deteriorated.

The color shift rate property will be described in detail with reference to FIG. 3.

Figure 3:
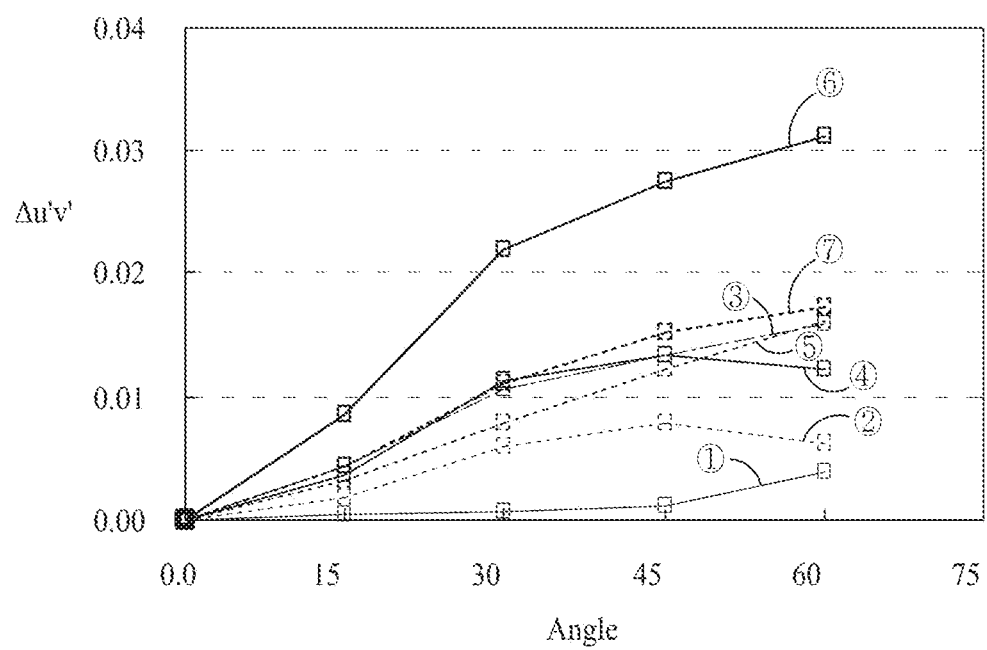
FIG. 3 is a diagram illustrating a color shift rate with respect to a viewing angle according to one embodiment of the present invention.

FIG. 3 is a diagram illustrating a color shift rate Δu'v' with respect to a viewing angle of the organic light emitting display device. In FIG. 3, a horizontal axis represents viewing angles of 0°, 15°, 30°, 45° and 60°, and a vertical axis represents a color shift rate Δu'v'.

That is, in FIG. 3, the color shift rate Δu'v' is measured at 0°, 15°, 30°, 45° and 60° at the front of the organic light emitting display device. The color shift rate Δu'v' in a specific viewing angle denotes a difference between the color shift rate in the viewing angle 0° and the color shift rate in the specific viewing angle. For example, the color shift rate Δu'v' in the viewing angle 60° denotes a difference between the color shift rate in the viewing angle 0° and the color shift rate of the viewing angle 60°. The viewing angle 60° may be an angle in a side direction of the organic light emitting display device. And the color shift rate Δu'v' is measured by CIE 1976 UCS diagram (u'v' coordinate system).

In FIG. 3, ① represents red, ② represents green, ③ represents blue, ④ represents yellow, ⑤ represents cyan, ⑥ represents magenta, and ⑦ represents white.

As shown in FIG. 3, it is noted that magenta ⑥ of which a color shift rate Δu'v' is 0.020 or more is generated in viewing angles 0° to 60° of the organic light emitting display device. If the color shift rate Δu'v' is 0.020 or more in a viewing angle direction of 0° to 60°, a consumer perceives color change with respect to the viewing angle. As seen from FIG. 2, the color shift rate of magenta generated by a mixture of a red and a blue is 0.030 or more. Also, magenta is highly perceived by eyes of the consumer, and a color abnormal level is increased if magenta is generated. Therefore, white light which is not uniform is displayed by the organic light emitting display device, and a color defect is generated.

In this respect, the inventors of the present invention have recognized the aforementioned problems and performed various experiments to satisfy the color shift rate of 0.020 or less and improve the color shift rate. The inventors of the present invention have recognized that it is difficult to improve blue efficiency within the range of a desired color shift rate even though the thicknesses of the emission portions may be increased to improve the color shift rate.

Also, the yellow-green emitting layer corresponding to a long wavelength area should be arranged to be far away from the second electrode to improve red efficiency. That is, the inventors of the present invention have recognized that a spacing between the blue emitting layer which is the first emitting layer constituting the first emission portion and the yellow-green emitting layer which is the second emitting layer constituting the second emission portion should be reduced to improve red efficiency. In order to reduce the spacing between the blue emitting layer and the yellow-green emitting layer, the thickness of the electron transporting layer or the charge generating layer between the blue emitting layer and the yellow-green emitting layer should be reduced. However, the inventors of the present invention have recognized that there is limitation in realizing the device having a long lifetime if the thickness of the charge generating layer or the electron transporting layer is reduced.

In this respect, the inventors of the present invention have invented an organic light emitting display device of a new structure, which may improve red efficiency and blue efficiency by allowing one emission portion to include two emitting layers, that is, a red emitting layer and a blue emitting layer, and may improve device efficiency and a color shift rate by optimizing thicknesses of organic layers constituting emission portions.

The organic light emitting display device of a new structure will be described with reference to FIGS. 4 to 8.

Figure 4:
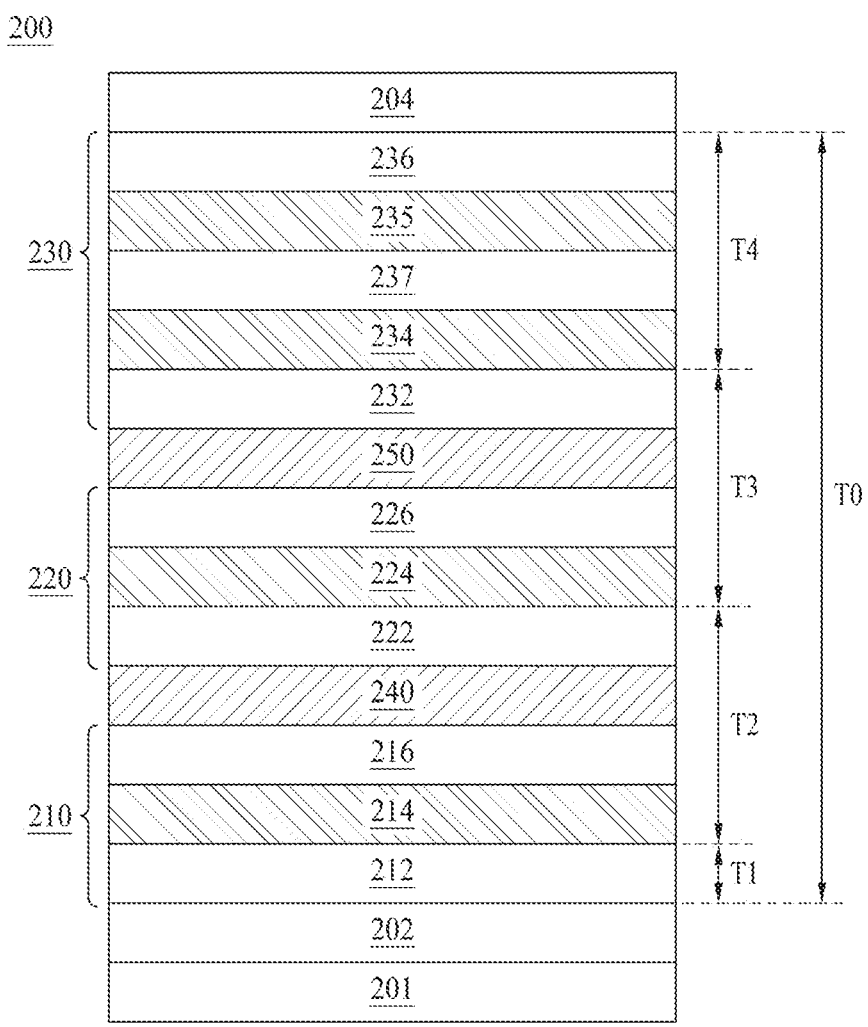
FIG. 4 is a brief cross-sectional diagram illustrating a white organic light emitting diode according to another embodiment of the present invention.

FIG. 4 is a brief cross-sectional diagram illustrating a white organic light emitting diode according to another embodiment of the present invention.

The white organic light emitting diode 200 shown in FIG. 4 includes first and second electrodes 202 and 204 on a substrate 201, and first, second and third emission portions 210, 220 and 230 between the first and second electrodes 202 and 204.

The first electrode 202 is a positive electrode for supplying holes, and may be formed of, but is not limited to, ITO (indium tin oxide), IZO (indium zinc oxide), etc. which are transparent conductive materials such as TCO (transparent conductive oxide).

The second electrode 204 is a negative electrode for supplying electrons, and may be formed of, but is not limited to, a metal material, such as Au, Ag, Al, Mo, Mg, or their alloys.

The first electrode 202 and the second electrode 204 may be referred to as anode and cathode, respectively.

Also, the first electrode 202 may include a transflective electrode and the second electrode 204 may include a reflective electrode, and vice versa.

Hereinafter, a bottom emission type, in which the first electrode 202 is a transflective electrode and the second electrode 204 is a reflective electrode, will be described.

The first emission portion 210 may include a first hole transporting layer (HTL) 212, a first emitting layer (EML) 214, and a first electron transporting layer (ETL) 216.

Although not shown, the first emission portion 210 may further include a hole injecting layer (HIL) above the first electrode 202. The hole injecting layer (HIL) is formed above the first electrode 202, and serves to actively inject holes from the first electrode 202.

The first hole transporting layer (HTL) 212 supplies the holes from the hole injecting layer (HIL) to the first emitting layer (EML) 214. The first electron transporting layer (ETL) 216 supplies electrons from the second electrode 204 to the first emitting layer (EML) 214 of the first emission portion 210.

The hole injection layer (HIL) may be formed of, but is not limited to, MTDATA(4,4',4"-tris(N-3-methylphenyl-N-phenylamino)triphenylamine), CuPc(phthalocyanine, copper complex) or PEDOT/PSS(poly(3,4-ethylenedioxythiphene/polystyrene sulfonate).

The holes supplied through the hole injecting layer (HIL) and the electrons supplied through the first electron transporting layer (ETL) 216 are recombined with each other in the first emitting layer (EML) 214, whereby light is generated.

The first hole transporting layer (HTL) 212 may include two or more layers or two or more materials. The first hole transporting layer (HTL) 212 may be formed of, but is not limited to, any one or more among NPD(N,N'-bis(naaphthalen-1-yl)-N,N'-bis(phenyl)-2,2'-dimethylbenzidine), TPD(N,N'-bis(3-methylphenyl)-N,N'-bis(phenyl)-benzidine), Spiro-TAD(2,2',7,7'-tetrakis(N,N-diphenlylamino)-9,9'-spirofluorene) and MTDATA(4,4',4"-tris(N-3-methylphenyl-N-phenylamino)triphenylamine).

The first electron transporting layer (ETL) 216 may include two or more layers or two or more materials. The first electron transporting layer (ETL) 216 may be formed of, but are not limited to, any one or more among $Alq_3$(tris (8-hydroxyquinolinato)aluminum), PBD(2-(4-biphenyl)5-(4-tert-butylphenyl)-1,3,4-oxadiazole), TAZ(3-(4-biphenyl)-4-phenyl-5-tert-butylphenyl-1,2,4-triazole), Liq(8-hydroxyquinolinolato-lithium) and BAlq(Bis(2-methyl-8-quinolinolate)-4-(phenylphenolato)aluminum).

The first emitting layer (EML) 214 may include a blue emitting layer, a deep blue emitting layer, or a sky blue emitting layer. And, the first emitting layer (EML) 214 includes in such a manner that a dopant is doped on at least one host. The host may include a single material or a mixed host of a mixture material. In more detail, the host may be formed of, but is not limited to, at least one fluorescent host material doped with a fluorescent blue dopant, wherein the fluorescent host material is one among anthracene derivatives, pyrene derivatives and perylene derivatives. The dopant of the first emitting layer (EML) 214 may be formed of, but is not limited to, a pyrene based material. A wavelength of the dopant in the first emitting layer (EML) 214 may be within a range of 440 nm to 480 nm.

A triplet energy of the first hole transporting layer (HTL) 212 and the first electron transporting layer (ETL) 216 is adjusted to be higher than a triplet energy of the host in the first emitting layer (EML) 214 as much as 0.01 eV to 0.4 eV. This is to allow excitons or triplet excitons formed in the first emitting layer (EML) 214 to be used for emission if possible by preventing them to move to interfaces above and below the first hole transporting layer (HTL) 212 or the first electron transporting layer (ETL) 216.

A first charge generating layer (CGL) 240 may further be provided between the first emission portion 210 and the second emission portion 220. The first charge generating layer (CGL) 240 controls charge balance between the first emission portion 210 and the second emission portion 220. The first charge generating layer 240 may include an N type charge generating layer (N-CGL) and a P type charge generating layer (P-CGL). The N type charge generating layer (N-CGL) injects electrons to the first emission portion 210, and the P type charge generating layer (P-CGL) injects holes to the second emission portion 220.

The N type charge generating layer (N-CGL) may be formed of, but are not limited to, an organic layer doped with alkali metal such as Li, Na, K or Cs or alkali earth metal such as Mg, Sr, Ba or Ra.

The P type charge generating layer (P-CGL) may be formed of, but is not limited to, a host of at least one organic material and a dopant of at least one organic material.

The first charge generating layer (CGL) 240 may include a single layer.

The second emission portion 220 may include a second hole transporting layer (HTL) 222, a second emitting layer (EML) 224, and a second electron transporting layer (ETL) 226. Although not shown, the second emission portion 220 may further include an electron injecting layer (EIL) above the second electron transporting layer (ETL) 226. Also, the second emission portion 220 may further include a hole injecting layer (HIL).

The second hole transporting layer (HTL) 222 may be formed of, but is not limited to, the same material as that of the first hole transporting layer (HTL) 212.

The second hole transporting layer (HTL) 222 may include two or more layers or two or more materials.

The second electron transporting layer (ETL) 226 may be formed of, but is not limited to, the same material as that of the first electron transporting layer (ETL) 216.

The second electron transporting layer (ETL) 226 may include two or more layers or two or more materials.

The second emitting layer (EML) 224 of the second emission portion 220 may include a yellow-green emitting layer or a green emitting layer. And, the second emitting layer (EML) 224 includes in such a manner that a dopant is doped on at least one host. The host may include a single material or a mixed host of a mixture material. In more detail, the host may be formed of a phosphorescent host material of a carbazol based compound or metal complex doped with a phosphorescent yellow-green dopant or green dopant. The carbazol based compound may include, but is not limited to, CBP(4,4'-bis(carbazol-9-yl)biphenyl), CBP derivative, mCP(1,3-bis(carbazol-9-yl)benzene) or mCP derivatives. The metal complex may include, but is not limited to, ZnPBO(phenyloxazole) or ZnPBT(phenylthiazole). The dopant of the second emitting layer (EML) 224 may be formed of, but is not limited to, an iridium based compound. A wavelength of the dopant in the second emitting layer (EML) 224 may be within a range of 540 nm to 580 nm.

A triplet energy of the second hole transporting layer (HTL) 222 and the second electron transporting layer (ETL) 226 is adjusted to be higher than a triplet energy of the host in the second emitting layer (EML) 224 as much as 0.01 eV to 0.4 eV. This is to allow excitons or triplet excitons formed in the second emitting layer (EML) 224 to be used for emission if possible by preventing them from moving to interfaces above and below the second hole transporting layer (HTL) 222 or the second electron transporting layer (ETL) 226.

The third emission portion 230 may include a third hole transporting layer (HTL) 232, a third emitting layer (EML) 234, a fourth emitting layer (EML) 235, and a third electron transporting layer (ETL) 236. The third emission portion 230 may further include an electron injecting layer (EIL) above the third electron transporting layer (ETL) 236. Also, the third emission portion 230 may further include a hole injecting layer (HIL).

The third hole transporting layer (HTL) 232 may be formed of, but is not limited to, TPD(N,N'-bis(3-methylphenyl)-N,N'-(bis)phenyl)-benzidine) or NPB(N,N'-di(naphthalen-1-yl)-N,N'-bis(phenyl)-benzidine).

The third hole transporting layer (HTL) 232 may include two or more layers or two or more materials.

The third electron transporting layer (ETL) 236 may be formed of, but is not limited to, the same material as that of the first electron transporting layer (ETL) 216 or the second electron transporting layer (ETL) 226.

The third electron transporting layer (ETL) 236 may include two or more layers or two or more materials.

A second charge generating layer (CGL) 250 may further be provided between the second emission portion 220 and the third emission portion 230. The second charge generating layer (CGL) 250 controls charge balance between the second emission portion 220 and the third emission portion 230. The second charge generating layer (CGL) 250 may include an N type charge generating layer (N-CGL) and a P type charge generating layer (P-CGL). The N type charge generating layer (N-CGL) serves to inject electrons to the second emission portion 220, and the P type charge generating layer (P-CGL) serves to inject holes to the third emission portion 230.

The N type charge generating layer (N-CGL) may be formed of, but is not limited to, an organic layer doped with alkali metal such as Li, Na, K or Cs or alkali earth metal such as Mg, Sr, Ba or Ra.

The P type charge generating layer (P-CGL) may be formed of, but is not limited to, a host of at least one organic material and a dopant of at least one organic material.

The second charge generating layer (CGL) 250 may include a single layer.

The first charge generating layer (CGL) 240 may be formed of, but is not limited to, the same material as those of the N type charge generating layer and the P type charge generating layer of the second charge generating layer (CGL) 250. The third emitting layer (EML) 234 of the third emission portion 230 includes a red emitting layer. The fourth emitting layer (EML) 235 includes one among a blue emitting layer, a deep blue emitting layer, and a sky blue emitting layer. And, each of the third emitting layer (EML) 234 and the fourth emitting layer (EML) 235 includes in such a manner that a dopant is doped on at least one host. The host may include a single material or a mixed host of a mixture material. In more detail, the host may be formed of, but is not limited to, at least one phosphorescent host material doped with a fluorescent dopant or phosphorescent dopant, wherein the phosphorescent host material includes CBP(4,4'-bis(carbazol-9-yl)biphenyl) or mCP(1,3-bis(carbazol-9-yl)benzene). The dopant of the third emitting layer (EML) 234 may be formed of, but is not limited to, an iridium based compound. The fourth emitting layer (EML) 235 may be formed of, but is not limited to, at least one fluorescent host material doped with a fluorescent blue dopant, wherein the fluorescent host material is one among anthracene derivatives, pyrene derivatives and perylene derivatives. The dopant of the fourth emitting layer (EML) 235 may be formed of, but is not limited to, a pyrene based material. Wavelengths of the dopants in the third emitting layer (EML) 234 and the fourth emitting layer (EML) 235 of the third emission portion 230 may be in the ranges of 660 nm to 640 nm and 440 nm to 480 nm.

A triplet energy of the third hole transporting layer (HTL) 232 and the third electron transporting layer (ETL) 236 is adjusted to be higher than a triplet energy of the host in the third emitting layer (EML) 234 and the fourth emitting layer (EML) 235 as much as 0.01 eV to 0.4 eV. This is to allow excitons or triplet excitons formed in the third emitting layer (EML) 234 and the fourth emitting layer (EML) 235 to be used for emission if possible by preventing them from moving to interfaces above and below the third hole transporting layer (HTL) 232 or the third electron transporting layer (ETL) 236.

An emission controlling layer (ECL) 237 may further be provided between the third emitting layer (EML) 234 and the fourth emitting layer (EML) 235. The emission controlling layer (ECL) 237 serves to control movement of electrons or holes to the emitting layer, and may be formed of the material of the hole transporting layer (HTL). Since the emission controlling layer (ECL) 237 controls movement of electrons or holes to the third emitting layer (EML) 234, blue efficiency corresponding to the fourth emitting layer (EML) 235 may be improved. If the material of the hole transporting layer is applied to the host in the third emitting layer (EML) 234, the emission controlling layer (ECL) 237 may be omitted.

Although the white organic light emitting diode according to one embodiment of the present invention is a bottom emission type, the white organic light emitting diode according to another embodiment of the present invention may be applied to a top emission type or a dual emission type. In the top emission type or the dual emission type, a whole thickness of the organic light emitting diode or location of each emitting layer may be varied depending on properties of the organic light emitting diode.

An organic light emitting display device, which includes an organic light emitting diode, according to another embodiment of the present invention, will be described with reference to FIG. 5.

Figure 5:
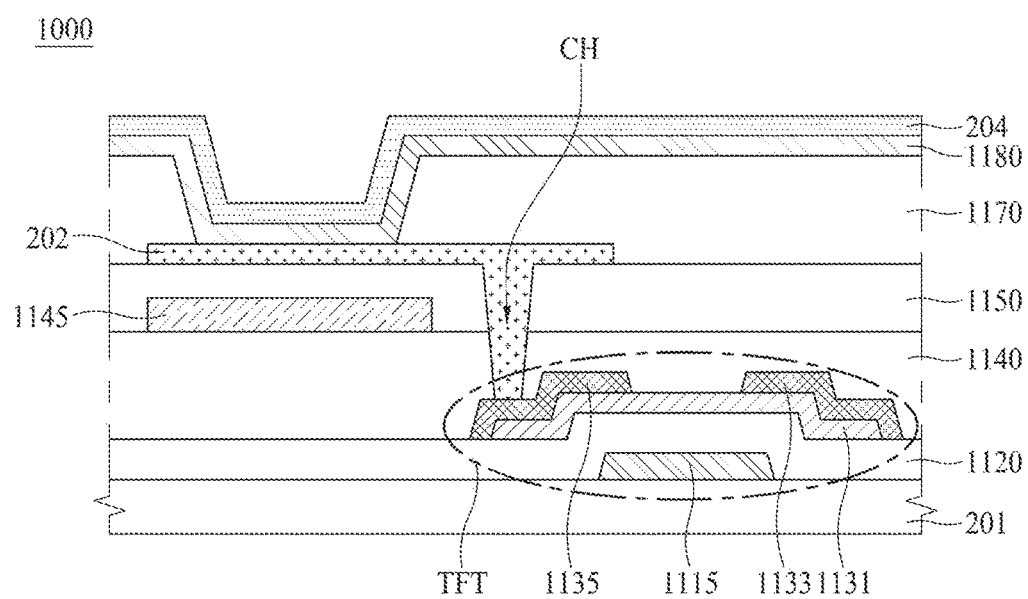
FIG. 5 is a brief cross-sectional diagram illustrating an organic light emitting display device according to still another embodiment of the present invention.

As shown in FIG. 5, the organic light emitting display device 1000 according to another embodiment of the present invention includes a substrate 201, a thin film transistor TFT, an overcoating layer 1150, a first electrode 202, an emission portion 1180, and a second electrode 204. The thin film transistor (TFT) includes a gate electrode 1115, a gate insulating layer 1120, a semiconductor layer 1131, a source electrode 1133, and a drain electrode 1135.

Although the thin film transistor (TFT) is shown in an inverted staggered structure in FIG. 5, the thin film transistor (TFT) may be formed in a coplanar structure.

The substrate 201 may be formed of glass, metal or plastic.

The gate electrode 1115 is formed on the substrate 201, and is connected to a gate line (not shown). The gate electrode 1115 may be a multi-layer having any one among Mo, Al, Cr, Au, Ti, Ni, Nd and Cu and their alloy.

The gate insulating layer 1120 is formed on the gate electrode 1115, and may be, but is not limited to, a silicon oxide (SiOx) film, a silicon nitride (SiNx) film, or a multi-layer of SiOx and SiNx.

The semiconductor layer 1131 is formed on the gate insulating layer 1120, and may be formed of amorphous silicon (a-Si), polycrystalline silicon (poly-Si), oxide semiconductor or organic semiconductor. If the semiconductor layer 1131 is formed of an oxide semiconductor, the semiconductor layer 1131 may be formed of, but is not limited to, ITO (Indium Tin Oxide), IZO (Indium Zinc Oxide), or ITZO (Indium Tin Zinc Oxide). Although an etch stopper may be formed on the semiconductor layer 1131 to protect the semiconductor layer 1131, the etch stopper may be omitted depending on the structure of the thin film transistor (TFT).

The source electrode 1133 and the drain electrode 1135 may be formed on the semiconductor layer 1131. The source electrode 1133 and the drain electrode 1135 may include a single layer or multi-layer having any one among Mo, Al, Cr, Au, Ti, Ni, Nd and Cu and their alloys.

A passivation layer 1140 is formed on the source electrode 1133 and the drain electrode 1135, and may be formed of a silicon oxide (SiOx) film, a silicon nitride (SiNx) film, or a multi-layer of SiOx and SiNx. Alternatively, the passivation layer 1140 may be formed of, but is not limited to, acrylic resin or polyimide resin.

The color filter 1145 is formed on the first passivation layer 1140, and is formed in a red sub pixel area, a blue sub pixel area and a green sub pixel area although one sub pixel area is only shown in FIG. 5. The color filter 1145 includes a red (R) color filter, a green (G) color filter, and a blue (B) color filter, which are patterned per sub pixel. The color filter 1145 transmits only light of a specific wavelength of white light emitted from the emission portion 1180.

The overcoating layer 1150 is formed on the color filter 1145, and may be, but is not limited to, an acrylic resin or polyimide resin, an oxide film (SiOx), a silicon nitride film (SiNx) or their multi-layer.

The first electrode 202 is formed on the overcoating layer 1150, and may be formed of, but is not limited to, ITO (indium tin oxide), IZO (indium zinc oxide), or the like, which is a transparent conductive material such as TCO (transparent conductive oxide). The first electrode 202 is electrically connected with the drain electrode 1135 through a contact hole CH of a predetermined area of the passivation layer 1140 and the overcoating layer 1150. Although the drain electrode 1135 and the first electrode 202 are electrically connected with each other in FIG. 5, the source electrode 1133 and the first electrode 202 may electrically be connected with each other through the contact hole CH of the predetermined area of the passivation layer 1140 and the overcoating layer 1150.

A bank layer 1170 is formed on the first electrode 202, and defines a pixel area. That is, the bank layer 1170 is formed in a boundary area between a plurality of pixels in a matrix arrangement, whereby the pixel area is defined by the bank layer 1170. The bank layer 1170 may be formed of an organic material such as benzocyclobutene (BCB) based resin, acrylic resin or polyimide resin. Alternatively, the bank layer 1170 may be formed of a photoresist that includes a black pigment. In this case, the bank layer 1170 serves as a light shielding member.

The emission portion 1180 is formed on the bank layer 1170. The emission portion 1180 includes a first emission portion 210 formed on the first electrode 202, a second emission portion 220 and a third emission portion 230 as shown in FIG. 4.

The second electrode 204 is formed on the emission portion 1180, and may be formed of, but is not limited to, Au, Ag, Al, Mo or Mg, or their alloys.

Although not shown in FIG. 5, an encapsulation portion may be provided on the second electrode 204. The encapsulation portion serves to prevent water from being permeated into the emission portion 1180. The encapsulation portion may be formed of a plurality of layers deposited with different inorganic materials, or may be formed of a plurality of layers alternately deposited with inorganic material and organic material. And, an encapsulation substrate may additionally be provided on the encapsulation portion. The encapsulation substrate may be formed of glass or plastic, or may be formed of metal. The encapsulation substrate may adhere to the encapsulation portion by an adhesive.

As shown in FIG. 4, the structure that the red emitting layer and the blue emitting layer are provided as the emitting layers of the third emission portion has been suggested to improve red efficiency and blue efficiency. The thicknesses of the organic layers constituting the emission portions have been optimized to improve device efficiency and the color shift rate property. This will be described with reference to FIG. 4. In FIG. 4, T0, T1, T2, T3 and T4 represent the organic layers arranged between the first electrode and the second electrode. Therefore, the inventors of the present invention suggest a TOL-FESE (Thickness of Organic Layers between the First Electrode and the Second Electrode) structure that the thicknesses of the organic layers arranged between the first electrode and the second electrode are different from one another so as to improve device's efficiency and the color shift rate property.

Also, the inventors of the present invention have recognized that the thickness of the first hole transporting layer in the first emission portion and the thickness of the third hole transporting layer in the third emission portion among various organic layers affecting determination of a cavity are important to improve the color shift rate property if the red emitting layer and the blue emitting layer are included as the emitting layers of the third emission portion. Therefore, the inventors have recognized that a blue efficiency and a color shift rate are varied in accordance with the thicknesses of the first hole transporting layer and the third hole transporting layer. Also, the inventors have recognized that a color shift rate of magenta is varied more rapidly in accordance with the thicknesses of the first hole transporting layer and the third hole transporting layer than a color shift rate of red, green, blue, yellow, cyan, or white. Therefore, the thicknesses of the first hole transporting layer and the third hole transporting layer have been optimized such that the color shift rate of all colors including magenta satisfies the range of 0.020 or less in a viewing angle direction of 0° to 60°. That is, the thickness of the first hole transporting layer is within a range of 90 nm to 110 nm and the thickness of the third hole transporting layer is within a range of 60 nm to 80 nm, whereby the structure of the organic light emitting display device satisfies the color shift rate in the range of 0.020 or less.

First of all, the thickness of the organic layers T0 arranged between the first electrode 202 and the second electrode 204 may be within a range of 370 nm to 445 nm.

The thickness of the first organic layer T1 arranged between the first electrode 202 and the first emitting layer (EML) 214 of the first emission portion 210 may be within a range of 90 nm to 110 nm. The first organic layer T1 may include the first hole transporting layer (HTL) 212, and may further include the hole injecting layer (HIL). The first hole transporting layer (HTL) 212 may include a single layer, or may include two layers. If the first hole transporting layer (HTL) 212 includes two layers, the thickness of the first hole transporting layer close to the first electrode may be thinner than the thickness of the first hole transporting layer close to the first emitting layer. Also, the thickness of the first organic layer T1 should be within a range of 90 nm to 110 nm even though the first hole transporting layer includes two layers. Also, although the layers constituting the first organic layer T1 may be varied depending on properties or structure of the device, the thickness of the first organic layer T1 should be within a range of 90 nm to 110 nm.

The thickness of the second organic layer T2 arranged between the first organic layer Ti and the second emitting layer (EML) 224 of the second emission portion 220 may be within a range of 60 nm to 75 nm. The second organic layer T2 may include the first emitting layer (EML) 214 and the first electron transporting layer (ETL) 216 of the first emission portion 210, the first charge generating layer (CGL) 240, and the second hole transporting layer (HTL) 222, and may further include the hole injecting layer (HIL) or the electron injecting layer (EIL). Although the layers constituting the second organic layer T2 may be varied depending on properties or structure of the device, the thickness of the second organic layer T2 should be within a range of 60 nm to 75 nm.

The thickness of the third organic layer T3 between the second organic layer T2 and the third emitting layer (EML) 234 of the third emission portion 230 may be within a range of 155 nm to 175 nm. The third organic layer T3 may include the second emitting layer (EML) 224 and the second electron transporting layer (ETL) 226 of the second emission portion 220, the second charge generating layer (CGL) 250, and the third hole transporting layer (HTL) 232, and may further include the hole injecting layer (HIL) or the electron injecting layer (EIL). Although the layers constituting the third organic layer T3 may be varied depending on properties or structure of the device, the thickness of the third organic layer T3 should be within a range of 155 nm to 175 nm.

The thickness of the fourth organic layer T4 between the third organic layer T3 and the second electrode 204 may be within a range of 65 nm to 85 nm. The fourth organic layer T4 may include the third emitting layer (EML) 234, the fourth emitting layer (EML) 235, the emission controlling layer (ECL) 237, and the third electron transporting layer (ETL) 236 of the third emission portion 230, and may further include the hole injecting layer (HIL) or the electron injecting layer (EIL). Since the thickness of the fourth organic layer T4 should be maintained even if the fourth organic layer T4 does not include the emission controlling layer (ECL) 237, the thickness of the third organic layer T3, which is adjacent to the fourth organic layer T4, or the fourth organic layer T4 should be compensated. Although the layers constituting the fourth organic layer T4 may be varied depending on properties or structure of the device, the thickness of the fourth organic layer T4 should be within a range of 65 nm to 85 nm.

If the thicknesses of the organic layers constituting each emission portion are applied as above, and if sum of the thicknesses of the first organic layer T1 and the third organic layer T3 is applied in the range of 245 nm to 285 nm, the color shift rate may be minimized without reduction of efficiency. As a result, red efficiency, green efficiency, and blue efficiency may be improved, and a desired color shift rate may be obtained. The thickness of the first hole transporting layer (HTL) 212 in the first organic layer Ti and the thickness of the third hole transporting layer (HTL) 232 in the third organic layer T3, which affect the cavity, may be adjusted, whereby blue efficiency and the color shift rate may be improved.

Since the thickness of the third hole transporting layer (HTL) 232 in the third organic layer T3 is not required to be increased, it is advantageous in that blue efficiency may be improved without deterioration of color purity even though the cavity of the blue emitting layer is moved to the long wavelength.

The red emitting layer may additionally be provided in the third emission portion, whereby red efficiency may be improved. Therefore, since the cavity of the yellow-green emitting layer is not required to be moved to a long wavelength to obtain a red color, a desired color coordinate may be obtained. Also, since the yellow-green emitting layer which is the second emitting layer corresponding to the long wavelength area is not required to be arranged at a location far away from the second electrode to improve red efficiency, the spacing between the first emitting layer of the first emission portion and the second emitting layer of the second emission portion may be obtained. Since the thickness of the first charge generating layer (CGL) 240 or the first electron transporting layer (ETL) 216, which affects lifetime of the device, is not required to be reduced by the obtained spacing between the first emitting layer of the first emission portion and the second emitting layer of the second emission portion, lifetime of the organic light emitting device may be improved.

Therefore, efficiency and color shift rate property may be improved by the TOL-FESE (Thickness of Organic Layers between the First Electrode and the Second Electrode) structure that the thicknesses of the organic layers between the first electrode and the second electrode are different from one another.

The result of efficiency and the color shift rate, etc. will be described with reference to Table 1, and FIGS. 6 to 8.

TABLE 1

| Items | | Embodiment 1 | Embodiment 2 |
|---|---|---|---|
| Color coordinate | Rx, Ry | 0.667, 0.331 | 0.676, 0.332 |
| | Gx, Gy | 0.307, 0.649 | 0.311, 0.653 |
| | Bx, By | 0.140, 0.053 | 0.143, 0.048 |
| | Wx, Wy | 0.309, 0.341 | 0.319, 0.332 |
| Color reproduction ratio | sRGB area ratio | 115.7 | 124.2 |
| | DCI coverage | 91.0 | 94.8 |
| Efficiency (cd/A) | R | 6.2 | 7.8 |
| | G | 33.6 | 33.8 |
| | B | 3.2 | 3.0 |
| | W | 82.1 | 83.7 |

In Table 1, the embodiment 1 is the organic light emitting display device having the organic light emitting diode shown in FIG. 1, and the embodiment 2 is the organic light emitting display device having the organic light emitting diode shown in FIG. 4.

As illustrated in Table 1, a red color coordinate (Rx, Ry) shows the results of (0.667, 0.331) in the embodiment 1 and (0.676, 0.332) in the embodiment 2, and a green color coordinate (Gx, Gy) shows the results of (0.307, 0.649) in the embodiment 1 and (0.311, 0.653) in the embodiment 2. Also, a blue color coordinate (Bx, By) shows the results of (0.140, 0.053) in the embodiment 1 and (0.143, 0.048) in the embodiment 2, and a white color coordinate (Wx, Wy) shows the results of (0.309, 0.341) in the embodiment 1 and (0.319, 0.332) in the embodiment 2. Therefore, it is noted that the embodiments 1 and 2 show color coordinate values of a similar level and the results satisfying desired colors.

Referring to a color reproduction ratio, sRGB area ratios show 115.7% in the embodiment 1 and 124.2% in the embodiment 2. A DCI (Digital Cinema Initiatives) coverage shows 91.0% in the embodiment 1 and 94.8% in the embodiment 2. As a result, it is noted that the color reproduction ratio is more improved in the embodiment 2 than the embodiment 1 and DCI color coordinate has been improved.

Referring to efficiency, red efficiency shows 6.2 cd/A in the embodiment 1 and 7.8 cd/A in the embodiment 2, whereby it is noted that red efficiency is more improved in the embodiment 2 than the embodiment 1. Also, green efficiency shows 33.6 cd/A in the embodiment 1 and 33.8 cd/A in the embodiment 2, whereby it is noted that the embodiment 1 is similar to the embodiment 2 in green efficiency. Also, blue efficiency shows 3.2 cd/A in the embodiment 1 and 3.0 cd/A in the embodiment 2, whereby it is noted that the embodiment 1 is similar to the embodiment 2 in blue efficiency. Also, white efficiency shows 82.1 cd/A in the embodiment 1 and 83.7 cd/A in the embodiment 2, whereby it is noted that white efficiency is more improved in the embodiment 2 than the embodiment 1. Therefore, it is noted that the embodiment 2 shows blue efficiency and green efficiency similar to those of the embodiment 1 and shows red efficiency and white efficiency more improved than those of the embodiment 1.

Figure 6:
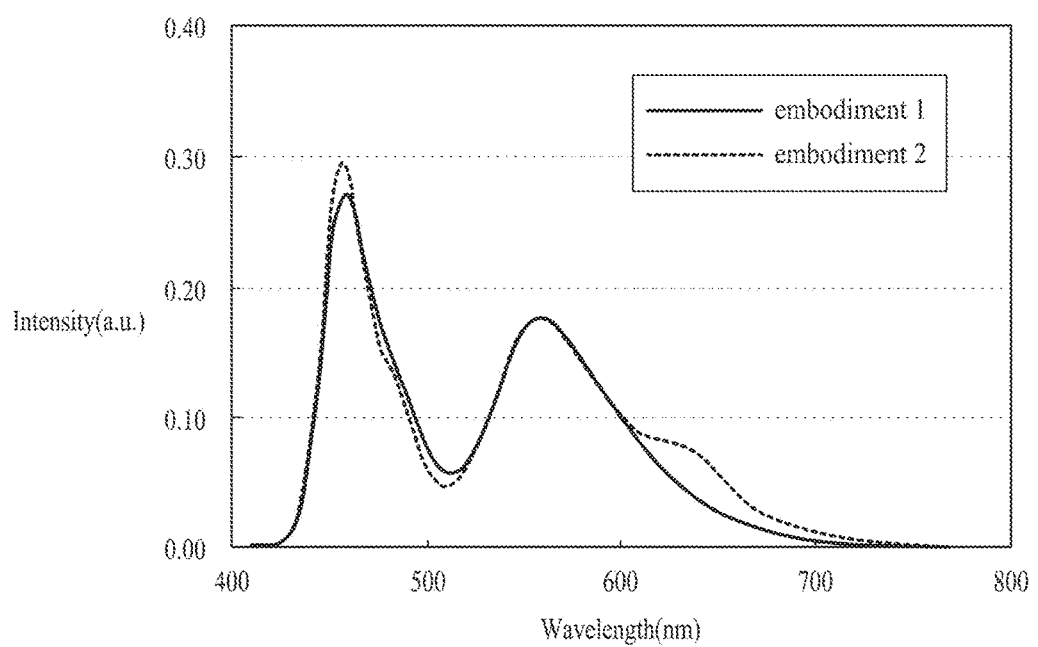
FIG. 6 is a diagram illustrating EL spectrum according to embodiments of the present invention.

FIG. 6 is a diagram illustrating EL spectrum of an organic light emitting display device according to embodiments of the present invention. In FIG. 6, a horizontal axis represents a wavelength (nm) of light, and a vertical axis represents electroluminescence intensity (a.u., arbitrary unit). Electroluminescence intensity is a numeric value expressed as a relative value based on a maximum value of EL spectrum. For example, as shown in FIG. 6, the electroluminescence intensity in the blue area having a range of 440 nm to 480 nm may be 0.30 (a.u.) and the electroluminescence intensity in the yellow-green area having a range of 540 nm to 580 nm may be 0.18 (a.u.) by conversion based on 0.30 (a.u.) which is a maximum value of the EL spectrum. That is, 0.18 (a.u.) is expressed as a relative value based on 0.30 (a.u.) which is the maximum value of the EL spectrum. Also, the electroluminescence intensity in the yellow-green area is expressed based on the electroluminescence intensity in the blue area which is the maximum value of EL spectrum.

Also, in FIG. 6, the embodiment 1 of the present invention is marked with a solid line, and the embodiment 2 of the present invention is marked with a dotted line. The embodiment 1 is the organic light emitting display device having the organic light emitting diode shown in FIG. 1, and the embodiment 2 is the organic light emitting display device having the organic light emitting diode shown in FIG. 4.

As shown in FIG. 6, it is noted from the embodiment 2 of the present invention that the third emission portion includes a red emitting layer and a blue emitting layer to generate EL peak corresponding to a red area. That is, it is noted that the embodiment 2 of the present invention has three EL peaks.

The EL peak corresponding to a blue area is within a range of 440 nm to 480 nm, and it is noted from the blue area that EL intensity of the embodiment 2 is more increased than EL intensity of the embodiment 1. Since this EL peak is generated by the first emitting layer of the first emission portion and the fourth emitting layer of the third emission portion, EL intensity of the embodiment 2 is more improved than that of the embodiment 1. Therefore, since EL intensity of a blue is improved, it is noted that blue efficiency is improved.

The EL peak corresponding to a yellow-green area or a green area is within a range of 540 nm to 580 nm, and it is noted from the yellow-green area or the green area that the embodiment 2 is similar to the embodiment 1 in EL intensity.

The EL peak corresponding to a red area is within a range of 600 nm to 640 nm, and it is noted that the red area is generated in the embodiment 2 of the present invention. This is because the EL peak corresponding to the red area is generated from the third emission portion including a red emitting layer and a blue emitting layer. In the embodiment 2, since the EL peak corresponding to the red area is generated by the red emitting layer in the third emission portion, the cavity of the yellow-green emitting layer is not required to be moved to a long wavelength. Therefore, since the cavity of the yellow-green emitting layer is not required to be moved to a long wavelength, a desired color coordinate may be obtained.

Therefore, it is noted that the embodiment 2 has three EL peaks as compared with the embodiment 1. That is, it is noted that three EL peaks are generated in the ranges of 440 nm to 480 nm which are EL peaks corresponding to the blue area, 540 nm to 580 nm which are EL peaks corresponding to the green area or the yellow-green area, and 600 nm to 640 nm which are EL peaks corresponding to the red area.

Figure 7:
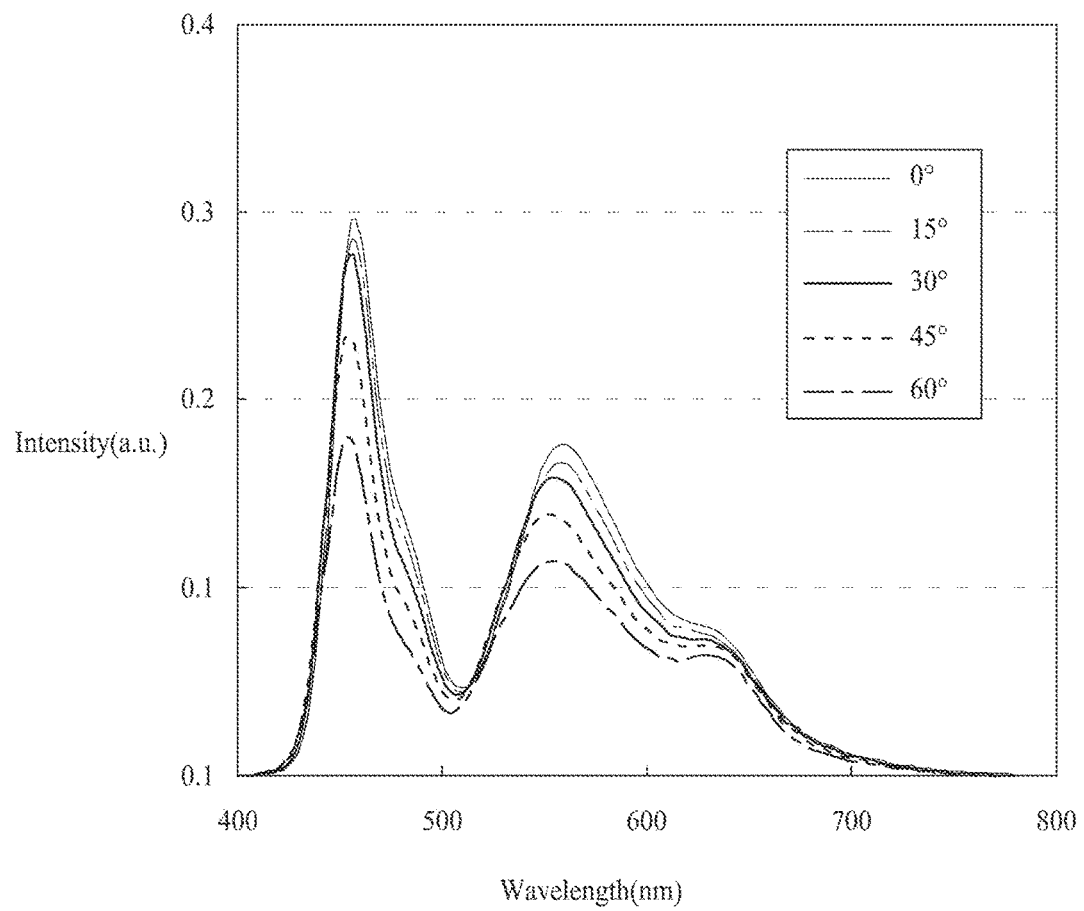
FIG. 7 is a diagram illustrating EL spectrum based on a viewing angle of an organic light emitting display device according to still another embodiment of the present invention.

FIG. 7 is a view illustrating EL spectrum based on a viewing angle of an organic light emitting display device according to still another embodiment of the present invention. In FIG. 7, a horizontal axis represents a wavelength area of light, and a vertical axis represents electroluminescence intensity. Electroluminescence intensity is a numeric value expressed as a relative value based on a maximum value of EL spectrum.

Also, in FIG. 7, a front side of the organic light emitting display device is set to 0° and an angle is varied from the front side, whereby the result of measurement at angles of 0°, 15°, 30°, 45° and 60° is shown.

In the embodiment 2 which is another embodiment of the present invention, the first emitting layer of the first emission portion includes one among a blue emitting layer, a deep blue emitting layer, and a sky blue emitting layer. The second emitting layer of the second emission portion includes a yellow-green emitting layer or a green emitting layer. The third emitting layer of the third emission portion includes a red emitting layer, and the fourth emitting layer includes one among a blue emitting layer, a deep blue emitting layer, and a sky blue emitting layer. Therefore, as shown in FIG. 7, it is noted that EL spectrum is generated in such a manner that the EL peak corresponding to the blue area of the first emission portion and the third emission portion is within a range of 440 nm to 480 nm, the EL peak corresponding to the yellow-green area or the green area of the second emission portion is within a range of 540 nm to 580 nm, and the EL peak corresponding to the red area of the third emission portion is in the range of 600 nm to 640 nm.

It is noted that the variance of the EL peak corresponding to the blue area is similar to the variance of the EL peak corresponding to the yellow-green area depending on the viewing angle. It is also noted that the EL peak is generated in the wavelength area corresponding to the red area. Therefore, even though the viewing angle is varied, the color coordinate of a white is not moved, whereby the color shift rate property may be obtained.

The color shift rate $\Delta u'v'$ with respect to the viewing angle will be described in detail with reference to FIG. 8.

Figure 8:
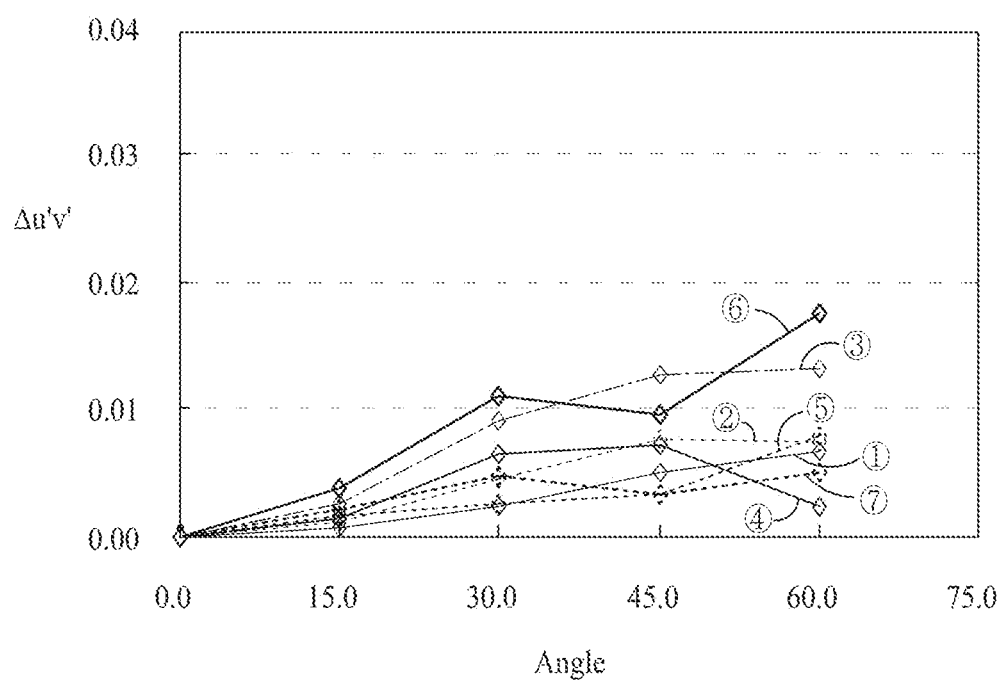
FIG. 8 is a diagram illustrating a color shift rate with respect to a viewing angle according to still another embodiment of the present invention.

FIG. 8 is a view illustrating a color shift rate $\Delta u'v'$ with respect to a viewing angle of the organic light emitting diode. In FIG. 8, a horizontal axis represents viewing angles, and a vertical axis represents a color shift rate. In FIG. 8, ① represents red, ② represents green, ③ represents blue, ④ represents yellow, ⑤ represents cyan, ⑥ represents magenta, and ⑦ represents white.

That is, in FIG. 8, the color shift rate $\Delta u'v'$ is measured at 0°, 15°, 30°, 45° and 60° from the front of the organic light emitting display device.

As shown in FIG. 8, it is noted that the color shift rate $\Delta u'v'$ of all colors displayed by the organic light emitting display device is 0.020 or less in viewing angles 0° to 60°. According to another embodiment of the present invention, since one emission portion includes a red emitting layer and a blue emitting layer, a red color is generated. Therefore, the color shift rate $\Delta u'v'$ of magenta generated by mixture of a red color and a blue color is 0.020 or less. If the color shift rate $\Delta u'v'$ is 0.020 or less, a consumer has a difficulty in perceiving color change with respect to the viewing angle. Therefore, in the present invention, the color shift rate $\Delta u'v'$ satisfies 0.020 or less, whereby color change of the organic light emitting display device with respect to the color shift rate may be avoided.

As described above, since one emission portion includes two emitting layers, such as a red emitting layer and a blue emitting layer, red efficiency and blue efficiency may be improved.

Also, one emission portion includes a red emitting layer and a blue emitting layer, and the thicknesses of the organic layers constituting the emission portion are optimized, whereby red efficiency, green efficiency and blue efficiency may be improved, and the color shift rate property of the organic light emitting display device may be improved.

Also, as the TOL-FESE (Thickness of Organic Layers between the First Electrode and the Second Electrode) structure in which the thicknesses of the organic layers arranged between the two electrodes are different from one another is applied, the color shift rate $\Delta u'v'$ satisfies 0.020 or less, whereby color change of the organic light emitting display device, which is caused by the color shift rate, may be avoided.

It will be apparent to those skilled in the art that various modifications and variations can be made in the present invention without departing from the spirit or scope of the inventions. Thus, it is intended that the present invention covers the modifications and variations of the present invention provided they come within the scope of the appended claims and their equivalents.

What is claimed is:

1. An organic light emitting display device, comprising:
   a first electrode corresponding to an anode and a reflective second electrode corresponding to a cathode facing each other on a substrate;
   a first emission portion on the first electrode;
   a second emission portion on the first emission portion; and
   a third emission portion on the second emission portion,
   wherein the third emission portion includes two emitting layers,
   wherein the two emitting layers includes a red emitting layer and one among a blue emitting layer, a deep blue emitting layer, and a sky blue emitting layer, and
   wherein the third emission portion is closer to the reflective second electrode than the first emission portion and the second emission portion.

2. The organic light emitting display device of claim 1, further comprising an emission controlling layer between the red emitting layer and the one among the blue emitting layer, the deep blue emitting layer, and the sky blue emitting layer.

3. The organic light emitting display device of claim 1, further comprising an emission controlling layer between the two emitting layers, the emission controlling layer having a material of a hole transporting layer.

4. The organic light emitting display device of claim 1, wherein a total thickness of all organic layers between the first electrode and the second electrode is within a range of 370 nm to 445 nm.

5. The organic light emitting display device of claim 4, wherein a sum of a first organic layer between the first electrode and a first emitting layer in the first emission portion and a third organic layer between a second organic layer and a third emitting layer in the third emission portion has a thickness in a range of 245 nm to 285 nm, and wherein the second organic layer is between the first organic layer and a second emitting layer in the second emission portion.

6. The organic light emitting display device of claim 5, wherein the first organic layer has a thickness in a range of 90 nm to 110 nm.

7. The organic light emitting display device of claim 5, wherein the third organic layer has a thickness in a range of 155 nm to 175 nm.

8. The organic light emitting display device of claim 5, wherein the second organic layer has a thickness in a range of 60 nm to 75 nm.

9. The organic light emitting display device of claim 8, wherein a fourth organic layer between the third organic layer and the second electrode has a thickness in a range of 65 nm to 85 nm.

10. The organic light emitting display device of claim 8, wherein the second emitting layer includes one among a yellow-green emitting layer and a green emitting layer.

11. The organic light emitting display device of claim 5, wherein the first organic layer includes a first hole transporting layer and the third organic layer includes a third hole transporting layer, and a thickness of the first hole transporting layer is greater than a thickness of the third hole transporting layer.

12. The organic light emitting display device of claim 11, wherein the thickness of the first organic layer and the thickness of the third organic layer are different from each other, each hole transporting layer having a specified thickness that provides the organic light emitting display device with color shift rate of all colors including magenta being within a range of 0.020 or less in viewing angles 0° to 60° of the organic light emitting display device.

13. The organic light emitting display device of claim 5, wherein the first emitting layer includes one among a blue emitting layer, a deep blue emitting layer, and a sky blue emitting layer.

14. The organic light emitting display device of claim 1, wherein the first emission portion has an electroluminescence (EL) peak in a range of 440 nm to 480 nm, the second emission portion has an EL peak in a range of 540 nm to 580 nm, and the third emission portion has an EL peak in a range of 600 nm to 640 nm and 440 nm to 480 nm.

15. The organic light emitting display device of claim 1, wherein a color shift rate is 0.020 or less in viewing angles 0° to 60° of the organic light emitting display device.

16. The organic light emitting display device of claim 15, further comprising a first charge generation layer between the first emission portion and the second emission portion, wherein the second organic layer includes the first charge generation layer.

17. The organic light emitting display device of claim 15, further comprising a second charge generation layer between the second emission portion and the third emission portion, wherein the third organic layer further includes the second charge generation layer.

18. The organic light emitting display device of claim 1, wherein a first organic layer is between the first electrode and a first emitting layer in the first emission portion, a second organic layer is between the first organic layer and a second emitting layer in the second emission portion, and a third organic layer is between a second organic layer and a third emitting layer in the third emission portion.

* * * * *